United States Patent [19]
Shiraishi

[11] Patent Number: 5,333,035
[45] Date of Patent: Jul. 26, 1994

[54] EXPOSING METHOD

[75] Inventor: Naomasa Shiraishi, Kawasaki, Japan

[73] Assignee: Nikon Corporation, Tokyo, Japan

[21] Appl. No.: 59,328

[22] Filed: May 11, 1993

[30] Foreign Application Priority Data

May 15, 1992 [JP] Japan ................... 4-123313

[51] Int. Cl.⁵ .................. G03B 27/32; G03B 27/42
[52] U.S. Cl. .................................... 355/77; 355/53
[58] Field of Search ............................ 355/53, 55, 77

[56] References Cited

U.S. PATENT DOCUMENTS

| | | | |
|---|---|---|---|
| 3,781,547 | 12/1973 | Thomas | 250/203 R |
| 3,849,001 | 11/1974 | Inoue et al. | 356/98 |
| 4,473,292 | 9/1984 | Mayer | 355/53 |
| 4,595,282 | 6/1986 | Takahashi | 355/53 |
| 4,724,466 | 2/1988 | Ogawa et al. | 355/43 |
| 4,805,000 | 2/1989 | Ogawa et al. | 355/43 |
| 4,992,825 | 2/1991 | Fukuda et al. | 355/53 |
| 5,063,582 | 11/1991 | Mori et al. | 378/34 |
| 5,155,523 | 10/1992 | Hara et al. | 355/53 |

FOREIGN PATENT DOCUMENTS 62-50811 10/1987 Japan .
63-316429 12/1988 Japan .

OTHER PUBLICATIONS

Naomasa Shiraishi et al, "New Imaging Technique for 64M-DRAM", SPIE vol. 1674 Optical/Laser Microlithography V, Mar. 11-13, 1992 pp. 741-752.

Primary Examiner—Richard A. Wintercorn
Attorney, Agent, or Firm—Shapiro and Shapiro

[57] ABSTRACT

An exposing method utilizing an exposure apparatus provided with an illuminating optical system and a projection optical system, wherein the illuminating optical system is adapted to illuminate a mask from an inclined direction with a predetermined incident angle, and the mask is provided with a periodic pattern composed of opaque portions and transparent portions narrower than the opaque portions, and wherein the projection optical system is adapted to form an image of the pattern on an object of exposure, coated with a photosensitive material subjected to a surface insolubilizing treatment, the exposing method comprising:

a first step of illuminating the periodic pattern by a light beam passing through an area eccentric from and not including the optical axis of the illuminating optical system on a Fourier transformation plane of the periodic pattern or a conjugate plate thereof in the illuminating optical system; and a second step for causing a relative displacement or a relative vibration between the image of the periodic pattern and the object of exposure in the axial direction of the projection optical system, during the illumination of the periodic pattern in the first step.

9 Claims, 9 Drawing Sheets

EXPOSING METHOD

BACKGROUND OF THE INVENTION

1. Field of the Invention

The present invention relates to an exposing method, and more particularly to a projection exposing method in the technology for forming circuit patterns for example of a semiconductor device, or a liquid crystal device.

2. Related Background Art

In the conventional exposing method, the light beam illuminating a reticle pattern enters the reticle with a specified angular range spreading range of light beam) having the center at the perpendicularly incident ray. However said angular range is about 0.6 times of the numerical aperature at the reticle side of the prejection optical system, and does not contain a very large incident angle.

In such apparatus, the resolving power and the depth of focus are mostly determined by the numerical aperture (NA) of the projection optical system and the exposing wavelength ($\lambda$). In general the resolving power is represented by $k \cdot \lambda/NA$, and the depth of focus is represented by $\lambda/NA^2$, wherein k is a constant determined by the performance of the photosensitive material (photoresist), and is in the order of 0.6. Also in the currently available apparatus, NA is abut 0.5, and $\lambda$ is mainly 0,365 $\mu$m (i line of mercury lamp).

Consequently, for obtaining a high resolving power, there can be employed an exposing apparatus in which NA is increased and the wavelength of the exposing light from the light source is shortened. The depth of focus is however drastically reduced in such case, and the mass production of integrated circuits becomes difficult due to deficient focus margin. Also the reduction in the wave-length of the exposing light is difficult to realize due to the lack of suitable optical material or photoresist material.

Recently, new technologies called annular illumination or modified light source are attracting attention. These technologies are to improve the resolving power and the depth of focus of the projection optical system by increasing the incident angle of the illuminating light (namely inclining the illuminating light) to the reticle pattern. These new illumination technologies (hereinafter collectively called modified light source technology) are effective for a line-and-space pattern (grating pattern), and particularly effective for a pattern in which the opaque portions are comparable to or finer than the transparent portions.

Such modified light source technologies were explained in "New Imaging Technique for 64M-DRAM" in the Optical/Laser Microlithography V, Vol. 1674, pp 741–752, issued at the International Society for Optical Engineering (SPIE) held 11–13 March, 1992.

Also for increasing the depth of focus, there are known methods of moving or vibrating the object of exposure (for example wafer) in the axial direction of the projection optical system during the exposing operation, or effecting exposures in plural positions different in the direction of height of photoresist (these methods being collectively called focus expanding methods). Such methods are particularly effective for an isolated island-shaped transparent pattern present in an opaque background, but such methods alone cannot provide an increase in the depth of focus in so-called line-and-space pattern in which the opaque portions and the transparent portions are regularly repeated. Such focus expanding method is disclosed for example in the U.S. Pat. No. 4,992,825.

Also insolubilization of the surface of a photo-resist film, for example with alkali rinsing, prior to exposure prevents the film decrease of the remaining pattern of the photoresist even for a low-contrast optical image of the reticle pattern, resulting from defocus or deficient resolving power, thereby providing a photoresist pattern with sufficient etching resistance. Such insolubilizing technology is disclosed in the Japanese Patent Laid-open Application No. 63-316429.

However, such surface-insolubilized photoresist tends to assume an inversely tapered profile (top portion of resist pattern being wider than bottom portion; such inversely tapered profile being particularly pronouced in a defocus state in which the wafer is positioned farther from the projection lens), based on an abrupt change in the intensity distribution of the optical image in the vicinity of the wafer surface in a defocus state, whereby the dimension after etching shows significant fluctuation. Consequently such insolubilizing technology cannot be easily applied to a pattern with a strict dimensional precision.

FIGS. 9 and 10(a) to 10(f) show photoresist profiles obtained by exposures in which the wafer surface is positioned at the best focus plane and the focus state is fixed (wafer is fixed). In such case the intensity distribution of the image varies strongly with the amount of defocus $\Delta F$. Corresponding to such variation, the resist profiles at the upper portion (1), intermediate portion (2) and lower portion (3) of a step on the wafer respectively assume forms shown in FIGS. 10(a), 10(b) and 10(c) or 10(d), 10(e) and 10(f), wherein the profiles shown in FIGS. 10(a), 10(b) and 10(c) are obtained with ordinary photoresist while those shown in FIGS. 10(d), 10(e) and 10(f) are obtained with surface-insolubilized photoresist. Thus, when the intensity distribution of the image varies strongly with the focus state as shown in FIG. 9, there is encountered an overhung profile as shown in FIG. 10(e) so that the surface insolubilization is not too much effective.

Based on the use of a positive-working photoresist, the recently proposed modified light source technologies are effective for a line-and-space pattern in which the opaque portions are comparable to or narrower than the transparent portions, but do not provide significant improvement in the resolving power and in the depth of focus, in a line-and-space pattern in which the opaque portions are wider than the transparent portions.

With the shift of the integrated circuits toward the finer geometry, there is an increased requirement for such line-and-space pattern in which the opaque portions are wider than the transparent portions, namely the resist film portions remaining after positive photoresist patterning are wider than the removed resist portions. Particularly in the dynamic random access memory (DRAM) of stacked capacitor type, in order to sufficiently secure the capacitance per a memory element, it is necessary to reduce the width of the removed resist portion constituting an insulating area between the electrodes of the capacitor, while maintaining the width of the remaining resist portions constituting the electrodes of the capacitor. Since such pattern requires the start of dissolution of positive photoresist at a higher light amount level, the improvement in the resolving power and in the depth of focus by the modified light source technologies is limited, in comparison with a pattern with a duty ratio of 1:1.

The line-and-space pattern with wider opaque portions based on the positive-working photoresist can be transformed into a line-and-space pattern with narrower opaque portions by the use of a negative-working photo-resist, so that the modified light technologies become effective, but this is imptactical because the performance of such negative-working photoresist is currently inferior to that of the positive-working photo-resist.

On the other hand, since the stacked capacitors constitute a densely arranged periodical pattern, the conventional focus extending method alone cannot provide an increased depth of focus, due to a fact that such method alone significantly deteriorates the image contrast for such densely arranged periodical pattern.

Also the dimensional fluctuation and the deformation of the pattern of the stacked capacitors lead to a functional error of the device. For this reason, the conventional insolubilization of the resist surface results in a significant pattern deformation due to the above-mentioned inversely tapered profile and is unacceptable in the periodical pattern with strict dimensional precision, such as the pattern of the stacked capacitors.

SUMMARY OF THE INVENTION

In order to resolve the drawbacks mentioned above, an object of the present invention is to provide an exposing method capable of improving the resolving power and the depth of focus of a periodical pattern, particularly a periodical pattern with strict dimensional precision, thereby providing a satisfactory photoresist profile.

A particular object of the present invention is to provide an exposing method capable of improving the resolving power and the depth of focus of a densely arranged periodical pattern with strict dimensional precision, in which the remaining resist portions (opaque portions) obtained with a positive-working photoresist become wider than the removed resist portions transparent portions), such as the pattern of the stacked capacitors, thereby providing a satisfactory photoresist profile.

Another object of the present invention is, in the exposure of a wafer coated with photoresist subjected to an insolubilizing treatment, to provide a uniform intensity distribution of resist image (contrast) in a direction perpendicular to the wafer surface (in the axial direction of the projection optical system).

Still another object of the present invention is, in the exposure of a wafer coated with photoresist subjected to an insolubilizing treatment, to provide a wider range of a uniform intensity distribution of resist image (contrast) in a direction perpendicular to the wafer surface (in the axial direction of the projection optical system).

In an embodiment of the present invention, the use of a focus extending method provides a uniform intensity distribution of the optical image (more precisely a synthesized image obtained by said focus extending method) in the vicinity of the wafer surface, in a direction perpendicular to the wafer surface (or in the axial direction of the projection optical system). For this reason, in the exposure of a wafer coated with photoresist subjected to an insolubilizing treatment, even if the wafer is in a defocus state, the photoresist does not assume the inversely tapered profile but maintains a satisfactory profile, in an axial range in which the intensity distribution of the optical image of the reticle pattern is uniform.

Consequently, even for a pattern in which the remaining resist portions are wider than the removed resist portions, such as the pattern of the stacked capacitors, the insolubilization of the photoresist surface and the focus extending method can improve the resolving power and the depth of focus in the practical sense. More specifically, there can be achieved an improvement in the resolving power, with a certain focus margin allowing to cope with a stepped geometry on the wafer.

Also in another embodiment of the present invention, a combination of the modified light source technology, the focus extending method and the insolubilizing treatment provides a high resolving power and a large depth of focus for a periodical pattern with a duty ratio of about 1:1 (for example opaque portion : transparent portion = 1.5:1) as an effect of said modified light source, and prevents the film decrease in a pattern in which the remaining resist portions are wider than the removed resist portions, by the combination of said focus extending method and the insolubilizing treatment.

DETAILED DESCRIPTION OF THE PREFERRED EMBODIMENTS

Figure 1:
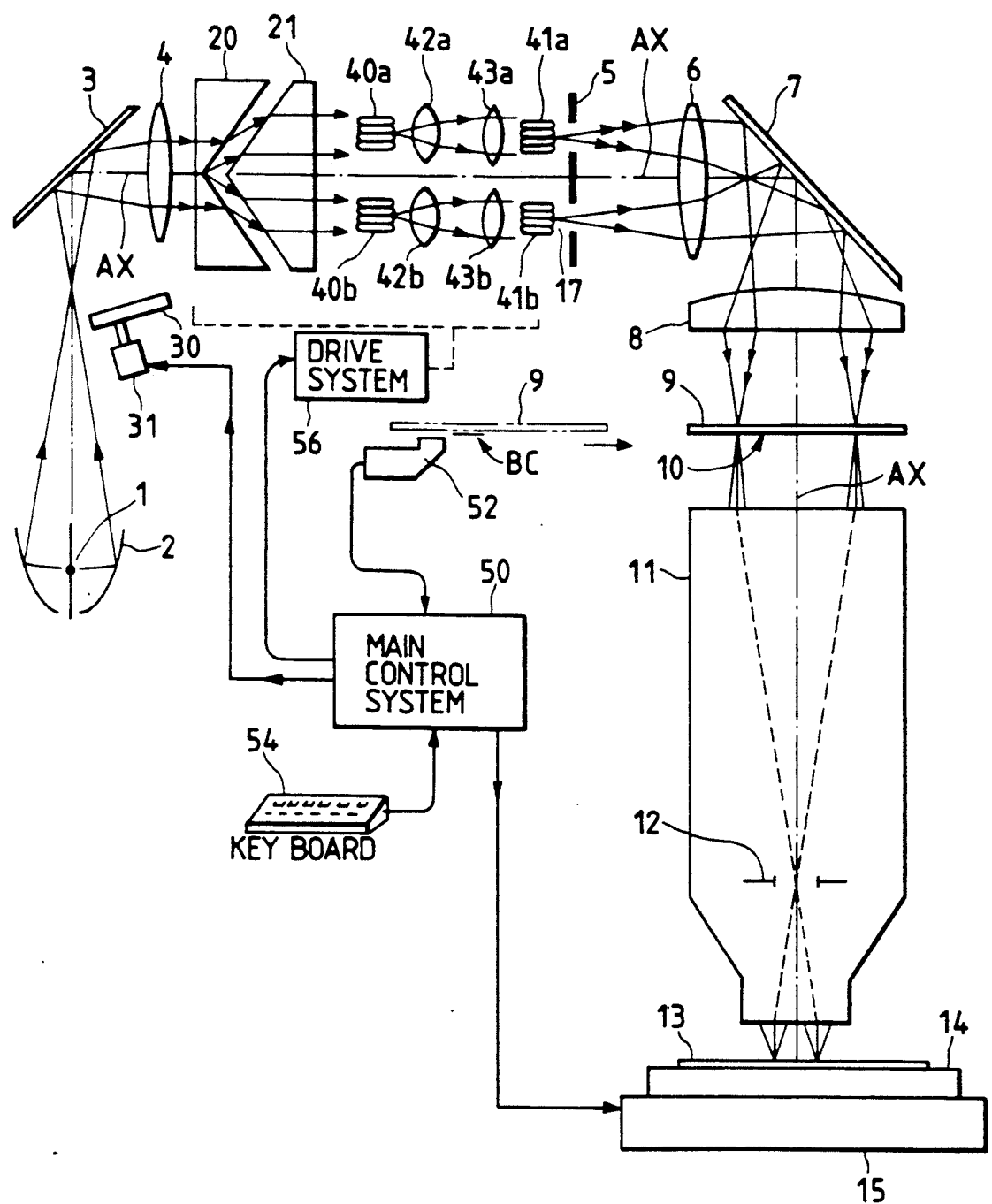
FIG. 1 is a schematic view of a projection exposure apparatus, constituting an embodiment of the present invention.

Now there will be described an embodiment of the present invention, with reference to FIG. 1, which is a schematic view of a projection exposure apparatus constituting a preferred embodiment of the present invention. A reticle 10, constituting the original of a circuit pattern or the like, is projected through a projection optical system 11 onto an object to be exposed 13, such as a wafer. Said wafer 13 is coated thereon with a photosensitive material, with a thickness of one to several microns. The wafer 13 is supported by a wafer holder 14, which is rendered movable three-dimensionally by a wafer stage 15. A light beam emitted by a light source 1 such as a high-pressure mercury lamp and an elliptical mirror 2 is guided through a mirror 3 and a relay lens 4 to a light beam splitting system 20, 21. The light beams therefrom are guided to the reticle 10, by the function of optical integrators 40, 41, 42, 43, condenser lenses 6, 8 and a mirror 7. The light beam splitting system in the present embodiment employs multi-faced prisms 20, 21 which split the illuminating light beam efficiently in terms of the light amount. The split optical integrators 40, 41 and lens systems 42, 43 provide uniform illumination intensity on the reticle 10.

The split optical integrator system is composed of first fly's eye lens group 40a, 40b, relay lenses 42a, 42b, 43a, 43b and second fly's eye lens group 41a, 41b, and a secondary light source is formed on the exit faces of the second fly's eye lenses 41a, 41b. The shape of the secondary light source (modified light source) formed on said exit faces may be further modified by a spatial filter 5. In the present embodiment, the distance between the light beam splitting system 20, 21 can be varied to change the positions of the light beams entering the first fly's eye lenses 40a, 40b, and, corresponding to the positions of said light beams, the distance of the first fly's eye lenses 40a, 40b (in a direction perpendicular to the optical axis AX) and the distance of the second fly's eye lenses 41a, 41b (in a direction perpendicular to the optical axis AX) can be respectively varied, in order to change the position of the secondary light source formed on the exit faces of the second fly's eye lenses 41a, 41b. The distance of the light beam splitting system 20, 21, and those of the first and second fly's eye lens groups are varied by a drive system 56.

The formed secondary (modified) light source plane 17 is in a relationship of optical Fourrier transformation with the reticle pattern 10 through the condenser lenses 6, 8 . Consequently, seince the fly's eye lenses are positioned out of the optical axis AX, the light beams emitted from the secondary light source faces 41a, 41b enter the reticle pattern in inclined manner. As described in the aforementioned "Optical/Laser Microlithography V : New Imaging Technique for 64M-DRAM", the resolving power and the depth of focus of the projection optical system can be significantly improved in comparison with those of the conventional illuminating method, by optimizing the incident angle of the illuminating light beams with respect to the reticle pattern.

In the above-explained embodiment, the light beams split by the light beam splitting system consisting of the multi-faced prisms 20, 21 are introduced into the split optical integrator consisting of the first fly's eye lenses 40a, 40b and the second fly's eye lenses 41a, 41b, but there may be adopted other methods for forming a modified light source by effectively splitting the light beam. For example there may be employed a configuration in which light beams split by a diffraction grating pattern or mirror is introduced into an optical integrator consisting of rod-shaped lenses. Otherwise there may be simply employed a spatial filter, in the ordinary illuminating optical system, at the Fourrier transformation plane to the reticle.

In FIG. 1, a main control system 50 initiates and terminates the exposure by controlling a shutter 30, 31, and, in synchronization with said exposure by the shutter 30, 31, displaces or vibrates the wafer stage 15 in the direction of the optical axis AX of the projection optical system. The velocity, amount of displacement, amplitude etc. of said displacement or vibration of the wafer stage 15 can be entered to the main control system 50 from a key-board 54.

Also in this apparatus the information of a bar code 52 provided on the reticle 9 is entered into the main control system 50. The bar code BC contains information on the pitch, direction of periodicity etc. of the reticle pattern, and information on exposure (for example control information of the shutter 30), and the main control system 50 controls the drive system 56 based on these information.

Figure 2:
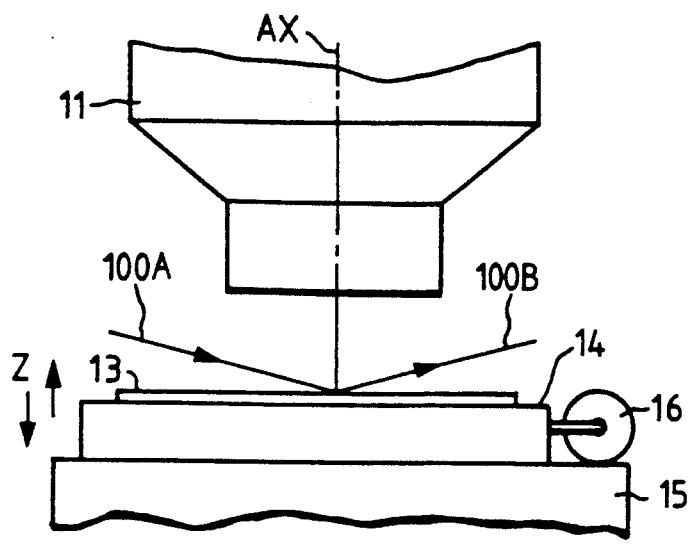
FIG. 2 is a partial view, showing the lower part of the projection optical system in the apparatus shown in FIG. 1.

FIG. 2 is a magnified view of the lower part of the projection optical system 11, the wafer 13, the wafer holder 14 and the wafer stagle 15.

Figures 3A, 3B:
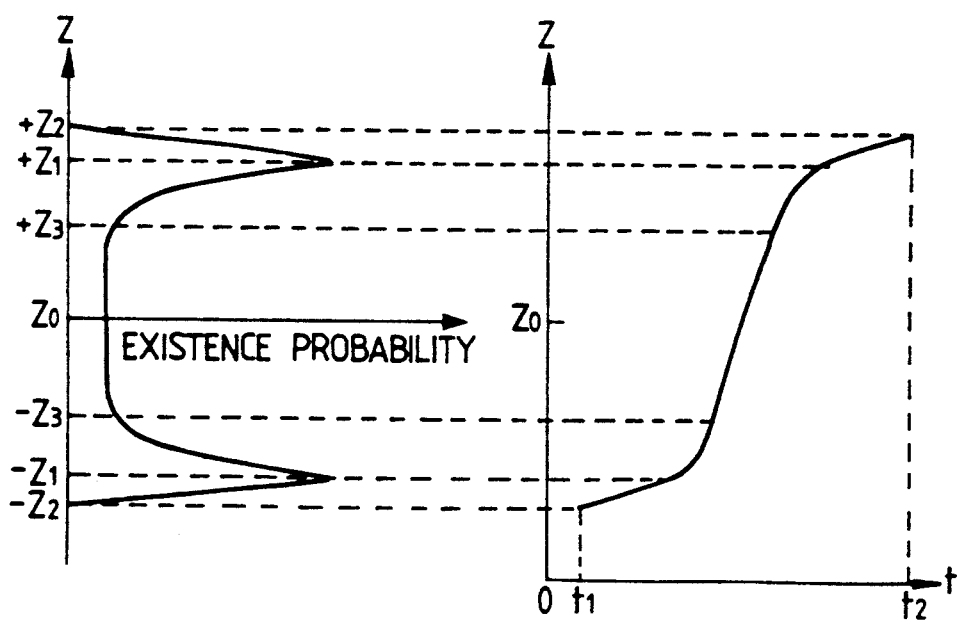
FIGS. 3 (A) and 3 (B) are charts showing time of presence of wafer per unit length on Z-axis.

In FIG. 2, 100A and 100B indicate the optical path of an optical sensor (AF sensor) detecting the position of the wafer 13 in the axial direction AX. In response to a signal from said AF sensor and the instruction from the main control system 50, a drive system 16 moves the wafer holder 14 as shown in FIG. 3(B) , which shows the movement of the wafer holder 14 within a period from $t_1$ to $t_2$. The wafer 13 (or wafer holder 14 ) is initially at a position $-Z_2$ in the direction of the optical axis AX, and is moved in the $+Z$ direction simultaneously with the opening of the shutter. The moving speed i s so controlled as to be smaller in the initial and end periods of displacement but larger in the intermediate period. FIG. 3 (A) shows the time of presence (probability of presence) of wafer 13 per unit length on the Z-axis. The shutter is closed at the end of displacement (time $t_2$) . The probability of presence shown in FIG. 3 (A) is approximately same as that in case of simple oscillation of the wafer 13 in the Z-direction.

The above-mentioned wafer displacement during the exposure is not much different from an operation of exposing the wafer at a position $-Z_1$ and re-exposing it at a position $+Z_1$ after wafer displacement, in the effect of obtaining an improved photoresist profile in the exposure of insolubilized photoresist, as will be explained later, based on a uniform intensity distribution of the optical image in the axial direction. However, the method of wafer displacement during the exposure is advantageous in the shorter process time.

The insolubilization treatment is to render the photoresist less soluble in the developing step. The surface insolubilization of photoresist can be attained by a pretreatment of the photoresist, coated on the wafer, with alkali solution. Thus the surface insolubilization of photoresist can be achieved by a simple method of alkali bathing.

Figure 4A:
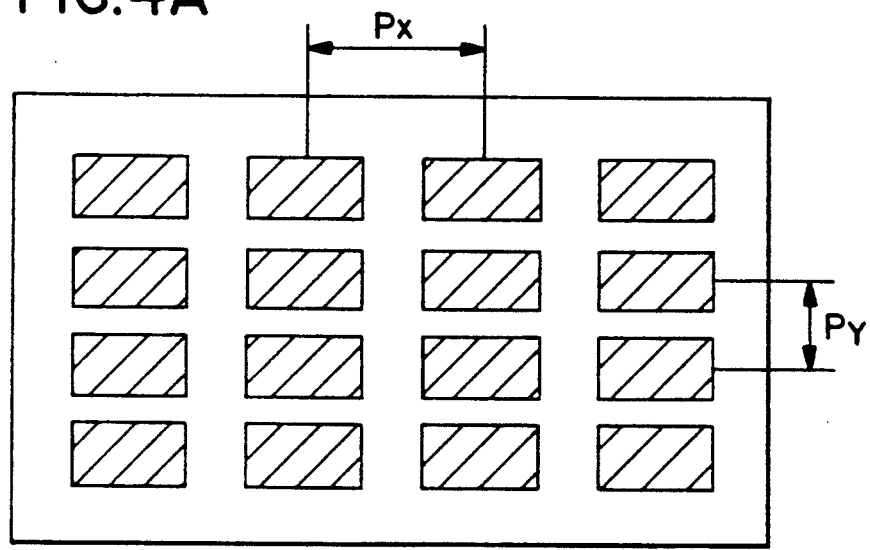
FIG. 4(a) is a view showing an example of the periodic pattern in which the opaque portions are wider than the transparent portions and only one pitch is present in the X-direction.
Figure 5A:
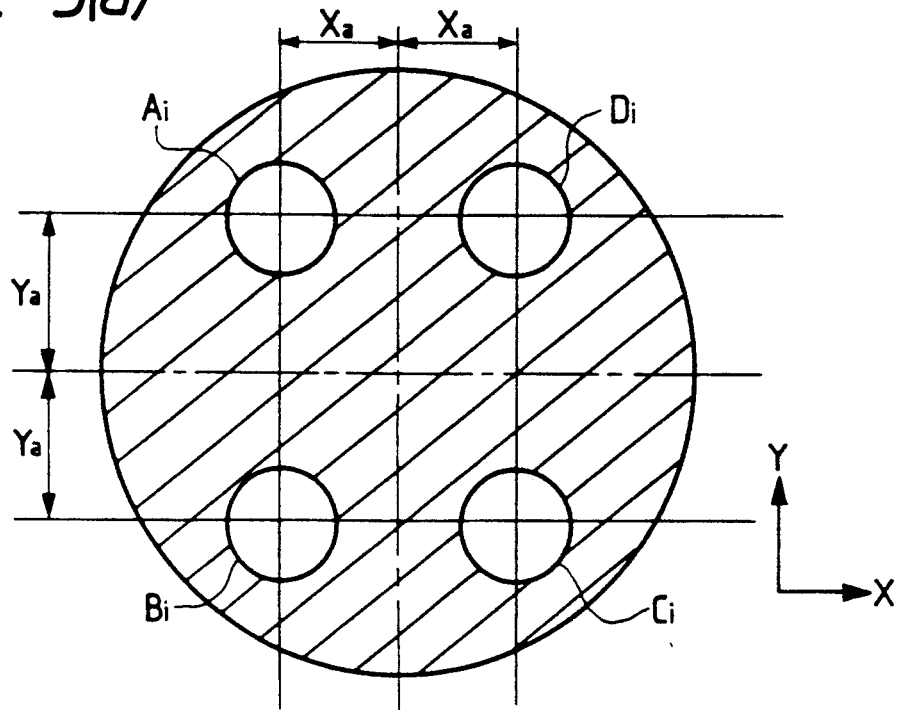
FIGS. 5(a) and 5(b) are views of spatial filters respectively optimum for the patterns shown in FIGS. 4(a) and 4(b)

FIG. 4(a) shows an example of the reticle pattern 10 for forming storage nodes (capacitors in DRAM), showing significant improvements in the present invention. Assuming the use of a positive-working photoresist, the opaque portions, represented as black in FIG. 4(a), constitute capacitor electrodes after the pattern transfer. In order to increase the capacitance of the capacitor (namely to improve the reliability of the memory device), the area of the black opaque portion should preferably be as large as possible. For this reason, the gap between the opaque portions is narrower than the width of said opaque portions. The pitches of the opaque portions are Px and Py respectively in the X (lateral) direction and in the Y (vertical) direction. Consequently this pattern can be regarded to have an extremely high periodicity. The aforementioned modified light source is extremely effective for a pattern of a high periodicity. For a pattern having different pitches in the X and Y directions, as shown in FIG. 4(a), there is preferably employed a modified light source as shown in FIG. 5(a), in which a hatched area indicates an opaque area (light amount=0) while four white areas constitute the secondary light sources. The distance of the secondary light sources is made wider in the Y direction with a finer pitch Py and narrower in the Y direction with a larger pitch Px, in order to achieve optimization in both directions. As the optimum positions of the secondary light sources are already disclosed in the aforementioned "Optical/Laser Microlithography V : New Imaging Technique for 64M-DRAM", there will only be given a simple explanation in this text. Assuming that the exit plane 17 shown in FIG. 1 and the reticle pattern plane are equal in magnification through a synthesized system of the condenser lenses 6, 8 with a synthesized focal length f, the optimum positions of the secondary light sources (Ai, Bi, Ci, Di) shown in FIG. 5(a) are given by:

$$Xa = f \cdot \lambda / (2 \cdot Px)$$

$$Ya = f \cdot \lambda / (2 \cdot Py)$$

As a result, if a secondary light source, for example Ai, is considered, three light beams generated from a light beam emitted from said secondary light source Ai and entering the reticle 9, namely the 0-th order diffracted light $D_0$, a 1st order diffracted light $D_x$ which is one of the ±1st order diffracted lights generated in the X-direction and a 1st order diffracted light $D_y$ which is one of the 1st order diffracted lights generated in the Y-direction, pass positions equally distanced from the optical axis AX on the pupil plane of the projection optical system 11, thereby improving the resolving power and the depth of focus. Also each of other secondary light sources Bi, Ci and Di is so positioned that three light beams (0-th order diffracted light $D_0$, 1st order diffracted lights Dx and Dy) pass positions equally distanced from the optical axis AX on the pupil plane 12 of the projection optical system 11.

Figure 5B:
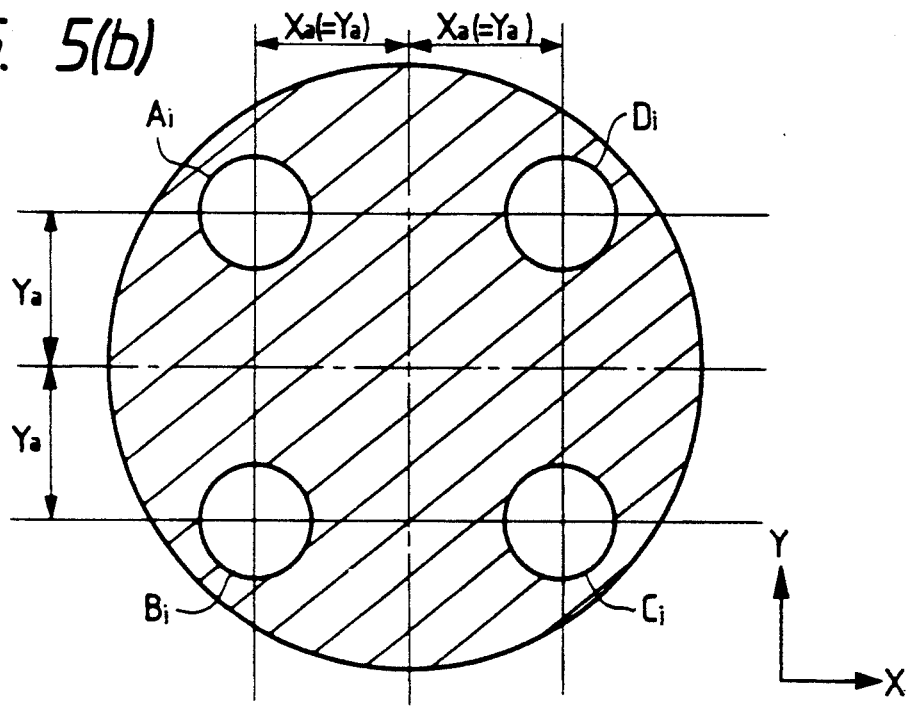

Otherwise a practically sufficient effect can be obtained by an arrangement of the secondary light sources as shown in FIG. 5(b), in which the distance of the secondary light sources is matched, both in the X and Y directions, with the finer pitch Py in the Y-direction. Stated differently a practically sufficient effect can be attained by a relation $Xa = Ya = f \cdot \lambda X / (2 \cdot Py)$.

Figure 4B:
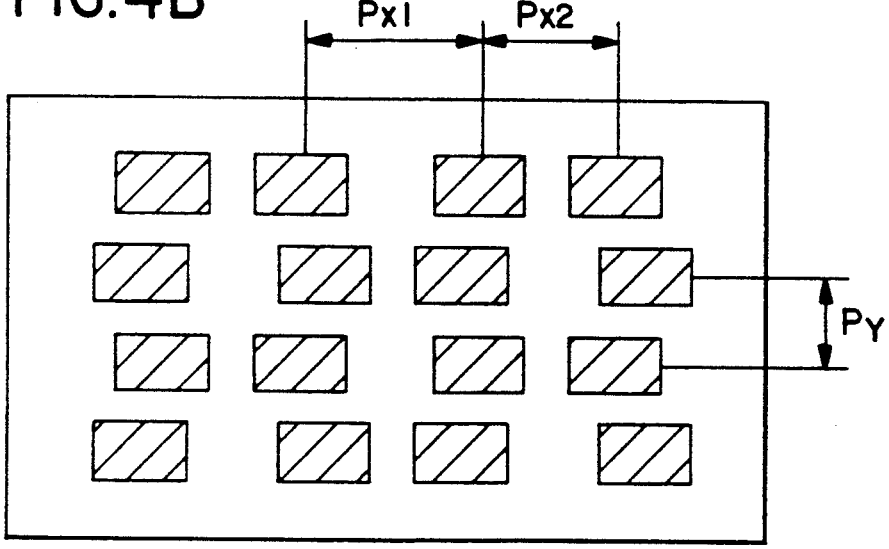
FIG. 4(b) is a view showing an example of the periodic pattern in which the opaque portions are wider than the transparent portions and two different pitches are present in the X-direction.

Also a pattern having two different pitches in the X-direction, as shown in FIG. 4(b), may also be used as a storage node pattern. The modified light source is effective also for the pattern shown in FIG. 4(b). as in the case of FIG. 4(a), by handling the synthesized pitch $(P_{x1} + P_{x2})/2$, wherein $P_{x1}$ and $P_{x2}$ are pitches in the X-direction, as the pitch $P_x$ in the pattern shown in FIG. 4(a).

However, as explained before, a periodic pattern containing the opaque portions (line portions) wider than the transparent (space) portions as shown in FIG. 4(a), is susceptible to the influence of defocus because the light amount level at which the photoresist starts to dissolve has to be made higher, so that the modified light source (including annular illumination) is less effective in improving the depth of focus in comparison with the case of line : space=1:1.

Figure 6A:
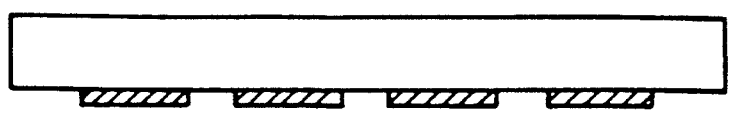
FIG. 6(a) is a cross-sectional view of a reticle pattern.
Figure 6B:
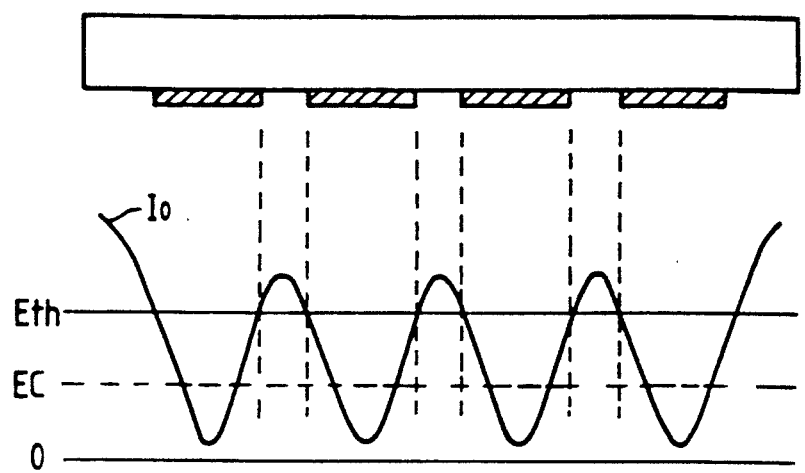
FIG. 6(b) is a chart showing the light amount distribution in a best focus state.
Figure 6C:
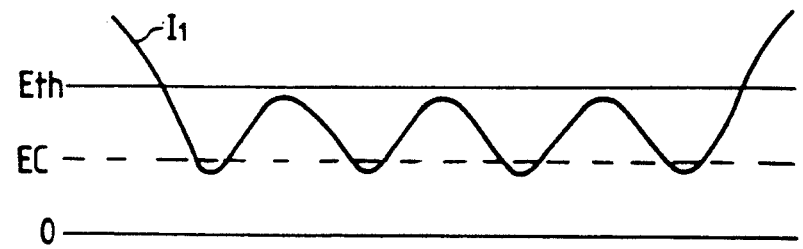
FIG. 6(c) is a chart showing the light amount distribution in a defocus state.

FIGS. 6(a) to 6(c) illustrate the optical image (light amount distribution) projected onto the wafer, in case of a pattern having a line-to-space ratio larger than unity as shown in FIG. 4(a) (hereinafter called a line rich pattern). FIG. 6(a) shows the cross section of a reticle pattern; FIG. 6(b) shows the light amount distribution $I_0$ at the best focus state; and FIG. 6(c) shows the light amount distribution $I_1$ at a defocus state. In these drawings, $E_{th}$ indicates a light amount level at which the photoresist can be completely dissolved by development, and $E_c$ indicates a light amount level drawings, $E_{th}$ indicates a light amount level at which the photoresist can be completely dissolved by development, and $E_c$ indicates a light amount level at which the photoresist starts to show a film decrease. In a line righ pattern, in order to obtain a desired line dimension in the best focus state as shown in FIG. 6(b), the exposure amount is so selected that the light amount level $E_{th}$ is positioned close to the maximum of the optical image which is substantially sinusoidal. In the defocus state with such setting, however, even the maximum of the optical image (light amount distribution) does not leach the level $E_{th}$ as shown in FIG. 6(c), so that it becomes difficult to completely dissolve the photoresist.

In order to effect exposure of such line rich pattern with a large depth of focus, it is desirable to obtain a uniform contrast in each defocus state, even at the sacrifice of the contrast of the optical image at the best focus state.

For this reason there is employed the focus extending method (displacing or vibrating the wafer 13 during the exposure, or exposing the wafer at a position $-Z_1$ and re-exposing said wafer after displacement thereof to a position $+Z_1$) to obtain a uniform intensity distribution of the optical image in each defocus state. Stated differently, the intensity distribution (contrast) of the optical image is rendered uniform with a predetermined range, in the axial direction of the projection optical system.

The photoresist film shows a decrease by the loss of contrast resulting from the use of the focus extending method. In order to avoid this phenomenon, the photoresist is subjected to the insolubilizing treatment prior to the exposure. Also as the intensity distribution of the optical image (contrast) is rendered uniform in each defocus state by the use of the focus extending method, the drawback of inversely tapered profile of the photoresist, resulting from the insolubilizing treatment, can be resolved by the combination of the focus extending method and the insolubilizing treatment.

Thus the combination of the focus extending method and the insolubilizing treatment can provide a satisfactory photoresist profile, not associated with profile deformation such as film decrease or inversely tapered profile, over a wide focus range. Stated differently, there can be extended the range in which the satisfactory photoresist profile can be obtained.

Furthermore, the use of the modified light source technology improves the resolving power and extends the range, in the axial direction of the projection optical system, in which the intensity distribution (contrast) of the optical image becomes uniform in each defocus state.

In summary, the present embodiment employs, in the exposure of a line righ pattern, the combination of the focus extending method (of displacing or vibrating the wafer 13 during the exposure, or exposing the wafer at a position $-Z_1$ and re-exposing it again at a position $+Z_1$), the insolubilizing treatment of the photoresist surface, and the modified light source technology, thereby improving the resolving power and extending the range providing the satisfactory photoresist profile, thus providing a satisfactory photoresist pattern.

Figures 7A, 7B, 7C:
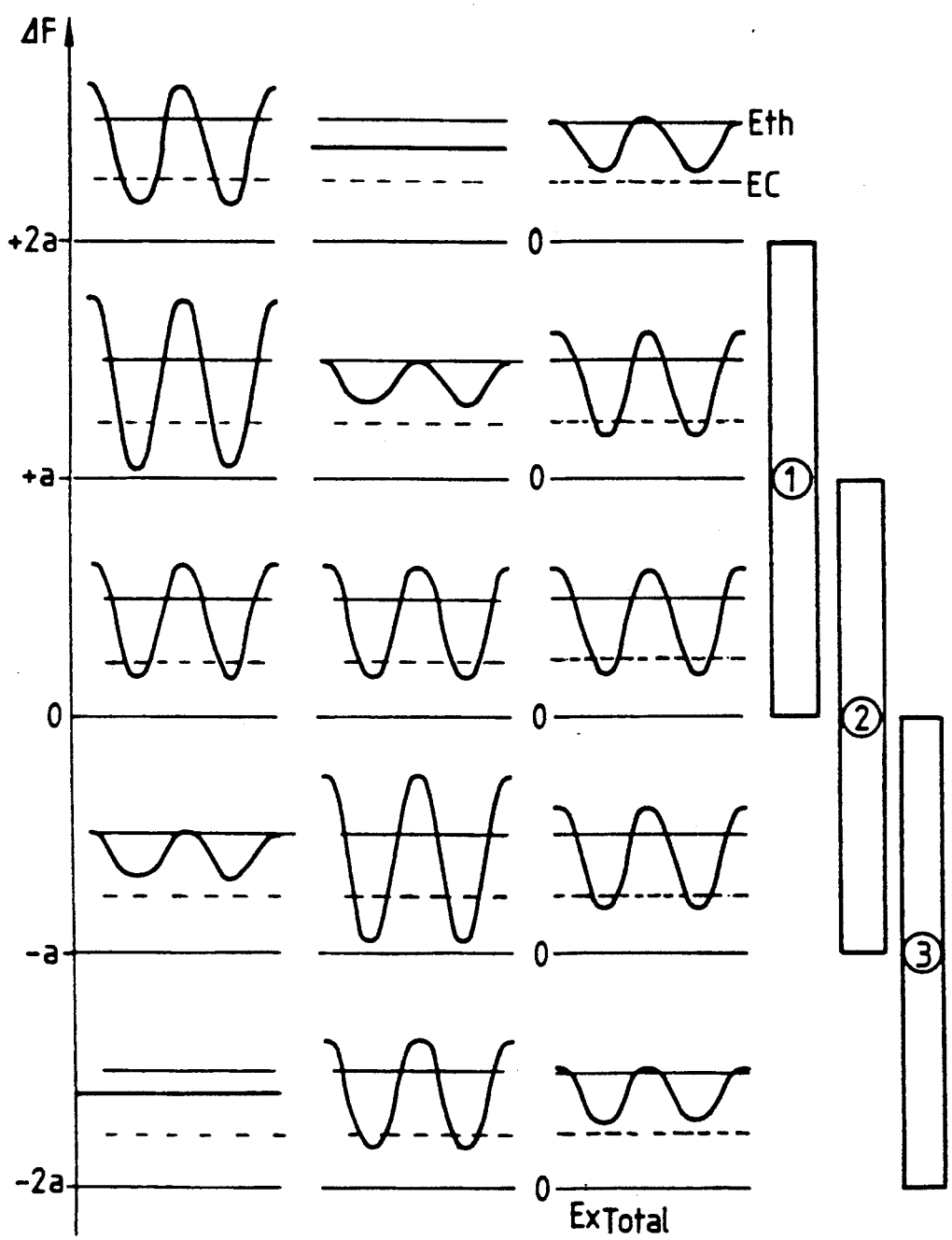
FIGS. 7(a), 7(b) and 7(c) are charts showing light amount distributions when a focus extending method is applied to the patterns shown in FIGS. 4(a) and 4(b)

FIGS. 7(a) and 7(b) show the light amount distribution in case the focus extending method is applied to a line rich pattern, wherein the ordinate ΔF indicates the positional aberration from the average wafer height (in the axial direction or in the Z-direction).

In the ordinate, ΔF=0 corresponds to the average height of the wafer surface (average height of the photoresist coated on the wafer surface), and + or − sign respectively corresponds to a direction approaching or separating from the projection optical system.

FIG. 7(a) shows the light amount distribution of the image in the vicinity of the wafer surface when the Z-position of the wafer stage is displaced by −a from the base focus position, while FIG. 7(b) shows the light amount distribution of the image in the vicinity of the wafer surface when the Z-position of the wafer stage is displaced by +a from the best focus position.

FIG. 7(c) shows the synthesized light amount $EX_{total}$ of these two exposures, wherein a solid line $E_{th}$ and a broken line $E_c$ have the same meanings as in FIGS. 6(a), 6(b) and 6(c).

Since FIG. 7(c) shows the synthesized light amount of two exposures respectively conducted at positions of the wafer stage displaced in the + and − directions by an equal amount from the best focus position, the light amount $EX_{total}$ shown in FIG. 7(c) can be regarded as the light amount distribution in each axial position when the average height of the wafer surface is positioned at the best focus plane.

On the other hand, the actual photoresist has a thickness of about 1 μm, and the wafer surface generally has a step of about 1 μm. Thus the areas (1), (2) and (3) shown corresponding to FIG. 7(c) represent photoresist of 1 μm in thickness, respectively at the upper, intermediate and lower part of the step present on the wafer (the amount 2a of displacement in this case is taken as 1 μm).

In FIGS. 7(a) to 7(c), for the convenience of explanation, the depth of focus (range in which the image contrast exceeds a certain value) of the projection optical system is assumed to be 1 μm, namely within the displacement amount ±a.

The displacement or vibration of the wafer in the axial direction with a stroke or an amplitude comparable to the depth of focus of the projection optical system allows to obtain uniform image contrast within said depth of focus, with the peak and the bottom of the light amount distribution respectively higher than $E_{th}$ and lower than $E_c$. Stated differently, within the depth of focus of the projection optical system, the image contrast varies scarcely and a satisfactory pattern can be obtained. On the other hand, when the focus extending method is not employed, a satisfactory photoresist pattern cannot be obtained for the line rich pattern, because the contrast is not constant even in the depth of focus of the projection optical system.

Figure 8A:
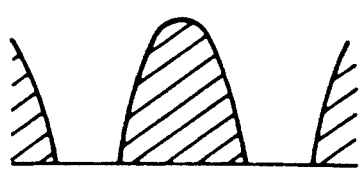
FIGS. 8(a), 8(b) and 8(c) are views showing photoresist profiles corresponding to the light amount distributions shown in FIGS. 7(a), 7(b) and 7(c)
Figure 8D:
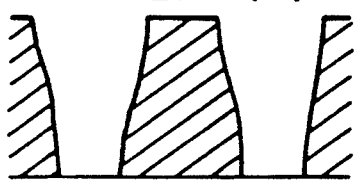
FIGS. 8(d), 8(e) and 8(f) are views showing photoresist profiles obtained with insolubilized photoresist, corresponding to the light amount distributions shown in FIGS. 7(a), 7(b) and 7(c)

For example in the photoresist area (1) at the upper position in FIG. 7(c), with the resist surface at ΔF= +2a, the intermediate position at ΔF= +a and the bottom position at ΔF=0, the light amount distribution $EX_{total}$ at the resist surface exceeds $E_c$ even in the dark line portion, and a certain constrast loss is observed in the intermediate position and the bottom position because of the focus extending method. Consequently the photoresist image develops a film decrease (a sufficient photoresist profile not remaining in the photoresist of the line portions in case of positive-working photoresist). Such state is shown in FIG. 8(a). FIGS. 8(a) to 8(f) show photoresist images, in which the hatched areas indicate the cross sections of photoresist. However, surface insolubilizing treatment prevents the film decrease in such line portions, thereby providing a satisfactory photoresist profile as shown in FIG. 8(d).

Figure 8B:
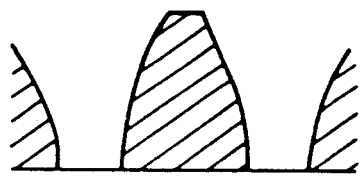
Figure 8E:
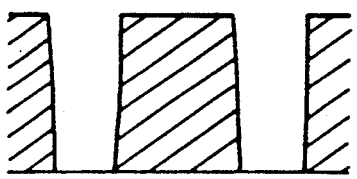

Also in the photoresist area (2) at the intermediate position (at the middle of the step on the wafer) in FIG. 7(c) at the best focus state, substantially same satisfactory light amount distributions are obtained at the resist surface (ΔF= +a), at the intermediate position (ΔF=0) and at the bottom position (ΔF= −a), but a certain which the light amount does not exceed $E_c$ decreases, contrast loss is observed because of the focus extending method. For this reason, the area in which the light amount does not exceed $E_c$ decreases, so that the ordinary photoresist assumes a nearly trapezoidal profile as shown in FIG. 8(b). On the other hand, the surface insolubilizing treatment can provide a satisfactory profile as shown in FIG. 8(e). In this state, since substantially same satisfactory light amount distributions are obtained at the resist surface (ΔF= +a), at the intermediate position (ΔF=0) and at the bottom position (ΔF= −a), the photoresist image is free from the change in the tapering depending on the state of defocus, and remains in satisfactory state.

Figure 8C:
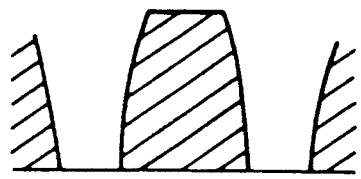
Figure 8F:
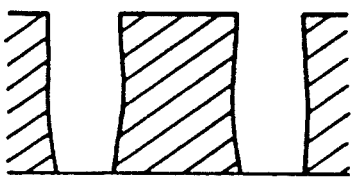
Figure 9:
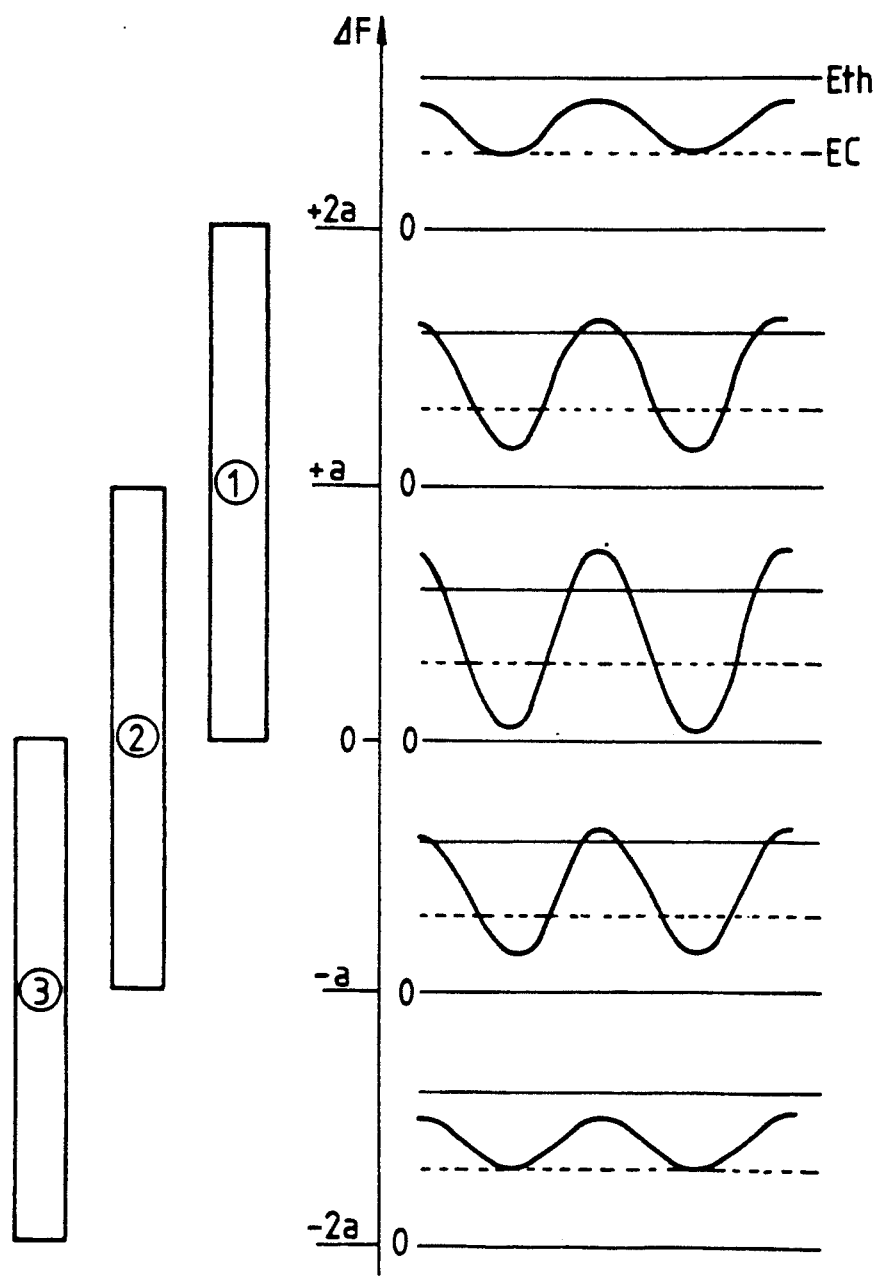
FIG. 9 is a chart showing the light amount distributions when the wafer is exposed, in a fixed state, to the patterns shown in FIGS. 4(a) and 4(b)

Furthermore, in the photoresist area (3) at the bottom position in FIG., 7(c) with the resist surface at ΔF=0, the intermediate position at ΔF= −a and at the bottom position at ΔF= −2a, the ordinary photoresist assumes a nearly trapezoidal profile as shown in FIG. 8(c), but the surface insolubilizing treatment can provide a satisfactory photoresist profile as shown in FIG. 8(f).

Figure 10A:
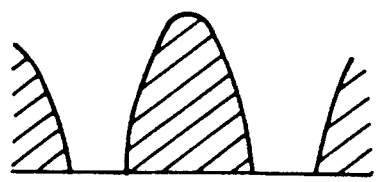
FIGS. 10(a), 10(b) and 10(c) are views showing photoresist profiles corresponding to the light amount distributions shown in FIG. 9.
Figure 10D:
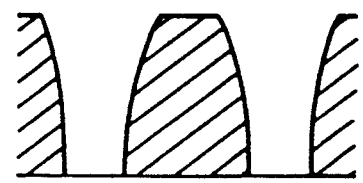
FIGS. 10(d), 10(e) and 10(f) are views showing photoresist profiles obtained with insolubilized photoresist, corresponding to the light amount distributions shown in FIG. 9.
Figure 10B:
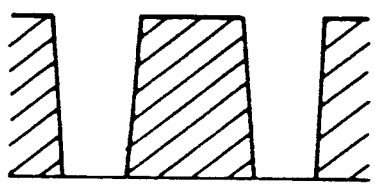
Figure 10E:
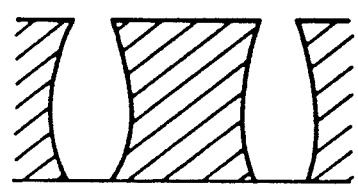
Figure 10C:
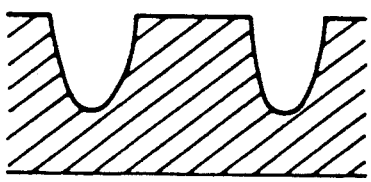
Figure 10F:
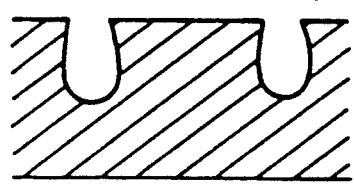

As explained before, FIGS. 10(a) to 10(f) show the states when the wafer is exposed in fixed state. FIGS. 10(a) to 10(c) show the case obtained with the ordinary photoresist, while FIGS. 10(d) to 10(f) show the respectively corresponding cases obtained with the photoresist subjected to surface insolubilization. In comparison with the cases shown in FIGS. 8(d) to 8(f), a sufficient focus range capable of providing a satisfactory photoresist profile cannot be obtained in any of FIGS. 8(a) to 8(f).

The level of the surface insolubilization explained in relation to FIGS. 8(a) to 8(f) can be so determined in advance as to obtain a satisfactory photoresist profile for example in the photoresist area (2), and the aforementioned alkali treatment can be conducted so as to obtain the desired level of surface insolubilization. Since the variation of the optical image in the Z-direction in the photoresist area (1) and that in the photoresist area (3) are close to that in the photoresist area (2), a satisfactory photoresist profile can be obtained in the photoresist area (1) or (3) if the level of surface insolubilization is so determined as to provide a satisfactory profile in the photoresist area (2).

In the foregoing explanation, the stroke or amplitude of the displacement or vibration of the wafer in the axial direction during the exposure is assumed comparable to the depth of focus of the projection optical system. A more ideal stroke or amplitude is such that the image contrast is uniform in the vicinity of the best focus plane, regardless of the value of ΔF.

For example the exposures may be conducted at three points of ΔF = −2a, ΔF = 0 and ΔF = +2a thereby obtaining a uniform image contrast regardless of the value ΔF.

It has been shown that a satisfactory photoresist profile can be obtained in the upper, intermediate and lower portions of the step present on the wafer, as shown in FIGS. 7 and 8, but such method is effective not only for the influence by the step on the wafer but also for the defocus resulting from an error in the focusing mechanism of the projection exposure apparatus. For the patterns as shown in FIGS. 4(a) and 4(b), the combination of the insolubilizing treatment and the focus extending method only will expand the depth of focus and provide a satisfactory photoresist profile. However the addition of the aforementioned modified light source technology expands the practical depth of focus of the projection optical system, and such expanded depth of focus may be utilized as the stroke or amplitude of the displacement or vibration of the wafer in the axial direction, whereby there can be expanded the focus margin in which the image contrast is uniform and the contrast loss is so limited that the peak of the light amount distribution remains above the level $E_{th}$ and the bottom of said distribution remains below the level $E_c$.

In this manner there can be expanded the range in which a satisfactory resist profile can be obtained. Consequently there is obtained an advantage of obtaining such satisfactory photoresist profile, even for a larger photoresist thickness or for a larger step on the wafer.

The combined use of the insolubilizing treatment and the focus extending method, or the combination thereof with the modified light source, is particularly effective in case, in the pattern shown in FIG. 4(a) or 4(b), the dimension of the opaque portions is about 1.5 times or larger of the dimension of the transparent portions.

The surface insolubilization can be attained, not only by the aforementioned alkali treatment, but also by letting the coated photoresist to stand in nitrogen gas. Also there may be conducted a pre-exposure bake or a post-exposure bake in nitrogen gas, and a similar effect can also be obtained by coating first photoresist and then coating another photoresist of a lower sensitivity thereon.

The foregoing embodiment is based on the use of positive-working photoresist, but the effect of the present invention can also be exhibited in combination with negative-working photoresist. Also in case of negative-working photoresist, surface insolubilization can be attained by coating, on first photoresist, another photoresist of a higher sensitivity.

The illuminating optical system amy employ the annular illumination, as it also expands the depth of focus of the periodic pattern. Also the combination of the surface insolubilization and the focus extending method is effective in case of exposure of a line rich pattern with a phase shift reticle, particularly of an edge-enhanced type phase shift reticle or a halftone reticle. The phase shift reticle is disclosed for example in the Japanese Patent Publication No. 62-50811 or in the Japanese Patent Laid-open Application No. 4-162039.

Furthermore, the light source 1 may be composed of an excimer laser or a harmonic wave of a YAG laser.

What is claimed is:

1. An exposing method utilizing an exposure apparatus provided with an illuminating optical system and a projection optical system, wherein said illuminating optical system is adapted to illuminate a mask from an inclined direction with a predetermined incident angle, said mask being provided with a periodic pattern including opaque portions and transparent portions, in which the width of said opaque portions is larger than that of said transparent portions; and wherein said projection optical system is adapted form an image of said pattern on an object of exposure on which coated in a photosensitive material subjected to a surface insolubilizing treatment, said exposing method comprising:

a first step of illuminating said periodic pattern with a light beam passing through an area eccentric from and not including the optical axis of said illuminating optical system, on a Fourier transformation plane of said periodic pattern or a conjugate plane thereto within said illuminating optical system; and a second step of causing a relative movement or a relative vibration between said image of the periodic pattern and said object of exposure, in the axial direction of said projection optical system, during the illumination of said periodic pattern in said first step.

2. An exposing method according to claim 1, wherein said relative displacement or vibration in the axial direction of said projection optical system is conducted by the displacement or vibration of said object of exposure.

3. An exposing method according to claim 1 or 2, wherein said relative displacement or vibration in the axial direction of said projection optical system is conducted approximately within the depth of focus of said projection optical system.

4. An exposing method according to claim 1, wherein the dimension of said opaque portions is about 1.5 times or larger of that of said transparent portions.

5. An exposing method according to claim 1, 2, or 4, wherein the illuminating light in said first step is composed of light beams passing through at least two separate areas eccentric from and not including the optical axis of said illuminating optical system on said Fourier transformation plane.

6. An exposing method according to claim 1, 2, or 4, wherein the illuminating light in said first step is a light beam passing through an annular area not including the optical axis of said illuminating optical system on said Fourier transformation plane.

7. An exposing method according to claim 1, 2, or 4, wherein said photosensitive material is a positive-working photoresist, and said surface insolubilizing treatment is conducted with alkaline solution.

8. An exposing method utilizing an exposure apparatus provided with an illuminating optical system and a projection optical system, wherein said illuminating optical system is adapted to illuminate a mask provided with a periodic pattern composed of transparent portions and opaque portions in which the width of said opaque portions is larger than that of said transparent portions; and wherein said projection optical system is adapted to form an image of said pattern on an object of exposure coated with a photosensitive material subjected to a surface insolubilizing treatment, said exposing method comprising:

a step of causing a relative displacement or a relative vibration between said image of the periodic pattern and said object of exposure in the axial direction of said projection optical system, during the illumination of said periodic pattern.

9. An exposing method according to claim 8, wherein said relative displacement or vibration in the axial direction of said projection optical system is conducted approximately within the depth of focus of said projection optical system.

* * * * *